United States Patent
Chin et al.

(10) Patent No.: US 7,888,162 B2
(45) Date of Patent: Feb. 15, 2011

(54) METHOD OF MANUFACTURING A PHOTOELECTRONIC DEVICE

(75) Inventors: Yu-Ling Chin, Hsinchu (TW); Li-Pin Jou, Hsinchu (TW); Yu-Chih Yang, Hsinchu (TW); Yu-Cheng Yang, Hsinchu (TW); Wei-Shou Chen, Hsinchu (TW); Cheng-Ta Kuo, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 12/511,812

(22) Filed: Jul. 29, 2009

(65) Prior Publication Data
US 2010/0029035 A1 Feb. 4, 2010

(30) Foreign Application Priority Data
Jul. 30, 2008 (TW) .............................. 97129154 A

(51) Int. Cl.
H01L 21/00 (2006.01)
H01L 21/44 (2006.01)
(52) U.S. Cl. .................... 438/72; 438/98; 438/597; 438/599; 257/E21.029; 257/E21.04; 257/E21.046
(58) Field of Classification Search .......... 257/E21.029, 257/E21.04, E21.046
See application file for complete search history.

(56) References Cited

U.S. PATENT DOCUMENTS

| 2004/0245648 | A1* | 12/2004 | Nagasawa et al. | 257/772 |
| 2010/0032012 | A1* | 2/2010 | Isaka et al. | 136/256 |
| 2010/0037942 | A1* | 2/2010 | Borland et al. | 136/255 |
| 2010/0068886 | A1* | 3/2010 | Yu et al. | 438/703 |
| 2010/0071754 | A1* | 3/2010 | Chang et al. | 136/246 |

FOREIGN PATENT DOCUMENTS

| CN | 101080264 | 11/2007 |
| CN | 101140977 | 3/2008 |

* cited by examiner

*Primary Examiner*—Savitri Mulpuri
*Assistant Examiner*—Mohsen Ahmadi
(74) *Attorney, Agent, or Firm*—Muncy, Geissler, Olds & Lowe, PLLC

(57) ABSTRACT

This application discloses a method of manufacturing a photoelectronic device comprising steps of providing a semiconductor stack layer, forming at least one metal adhesive on the semiconductor stack layer by a printing technology, forming an electrode by heating the metal adhesive to remove the solvent in the metal adhesive, wherein an ohmic contact is formed between the electrode and the semiconductor stack layer.

11 Claims, 13 Drawing Sheets

METHOD OF MANUFACTURING A PHOTOELECTRONIC DEVICE

CROSS REFERENCE TO RELATED APPLICATIONS

This application claims the right of priority based on Taiwan Patent Application No. 097129154 entitled "Method of Manufacturing a Photoelectronic Device", filed on Jul. 30, 2008, which is incorporated herein by reference and assigned to the assignee herein.

TECHNICAL FIELD

The present application generally relates to a method of manufacturing a photoelectronic device, and more particularly to a method of manufacturing the electrodes of the photoelectronic device.

BACKGROUND

The semiconductor material is widely applied in the photoelectronic devices like light-emitting diode, laser diode and photovoltaic cell, and how to reduce the production cost and simplify the processes to increase the manufacturing efficiency has become a main topic for the industry.

FIG. 1A to FIG. 1G show a generally-known process flow of forming a photoelectronic device. As FIG. 1A shows, a substrate 10 is provided first, which is conductive. As FIG. 1B shows, a semiconductor stack layer 12 is formed on the substrate 10, and the semiconductor stack layer 12 includes at least a first conductive type semiconductor layer 120, an active layer 122, and a second conductive type semiconductor layer 124 from up to down. As FIG. 1C shows, a metal layer 14 is formed on the semiconductor stack layer 12 by the evaporation technology. Next, as FIG. 1D shows, a photoresist 16 is formed on the metal layer 14. As FIG. 1 E shows, a portion of the photoresist 16 is reacted with the light passing through the mask 18 and leaves another portion of the photoresist 16' on the metal layer 14. As FIG. 1F shows, a portion of the metal layer 14 not covered by the photoresist is etched to form a first electrode 20. Finally, as FIG. 1G shows, the photoresist 16 is removed, and a second electrode 22 is formed under the substrate 10 by the evaporation, then a photoelectronic device 100 is formed.

From the above description, it is known that the size and the position of the electrode of the photoelectronic device is defined by the size and the position of the opening 180 of the mask 18. Only one kind of metal material can be used to form the metal layer by the above-mentioned process, and the selection of the metal material is also restricted by the evaporation technology. Furthermore, more processes like the exposure, lithography, etching, and removal of the photoresist are needed to form a electrode, which increases the production cost of manufacturing the photoelectronic device.

SUMMARY

One purpose of the present application is to provide a method for manufacturing a photoelectronic device, included forming a metal adhesive on a semiconductor stack layer by a printing technology and form a metal electrode by energizing the metal adhesive, wherein an ohmic contact is formed between the metal electrode and the semiconductor stack layer.

Another purpose of the present application is to form a metal electrode by a printing technology to simplify the process and decrease the process cost of the manufacturing a photoelectronic device.

Another purpose of the present application is to form a metal electrode by a printing technology to increase the material selection of the metal electrode and the variety of the photoelectronic device products.

The foregoing aspects and many of the attendant purpose, technology, characteristic, and function of this application will become more readily appreciated as the same becomes better understood by reference to the following embodiments detailed description, when taken in conjunction with the accompanying drawings.

DETAILED DESCRIPTION OF THE PREFERRED EMBODIMENTS

The present application discloses a manufacturing process to form an ohmic contact electrode on the semiconductor stack layer by a printing technology. The present application discloses the technology that can be applied generally in the manufacturing processes of various photoelectronic devices such as light-emitting diode, laser diode, and photovoltaic cell. It can be better understood by reference to the following detailed description of the embodiments when taken in conjunction with the accompanying drawings.

Figure 1A:
FIGS. 1A-1G illustrate a known process flow of forming a photoelectronic device.
Figure 1B:
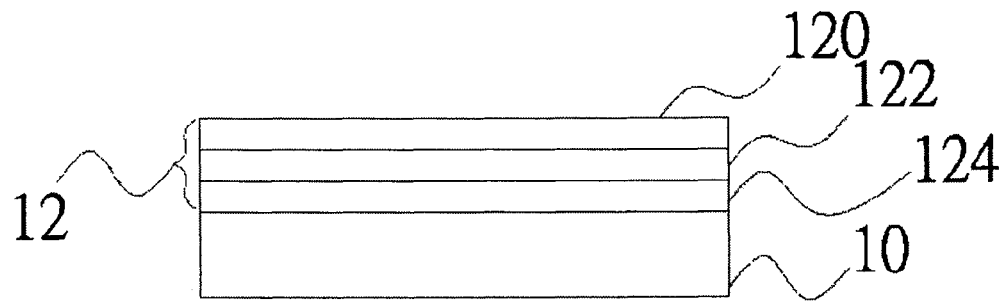
Figure 1C:
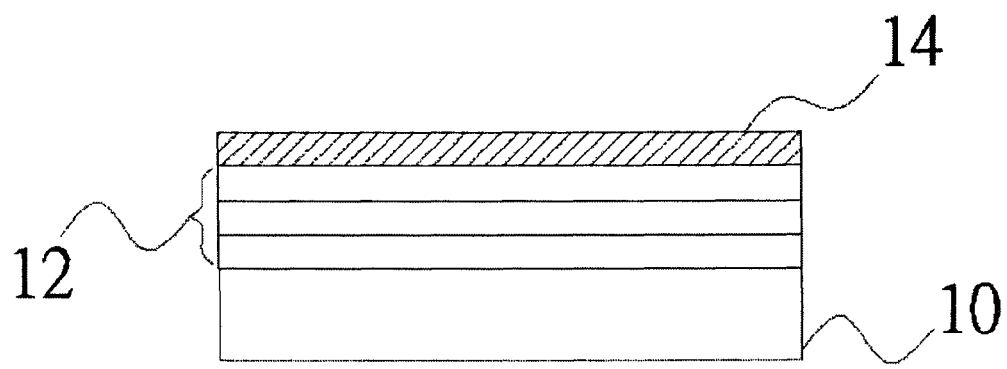
Figure 1D:
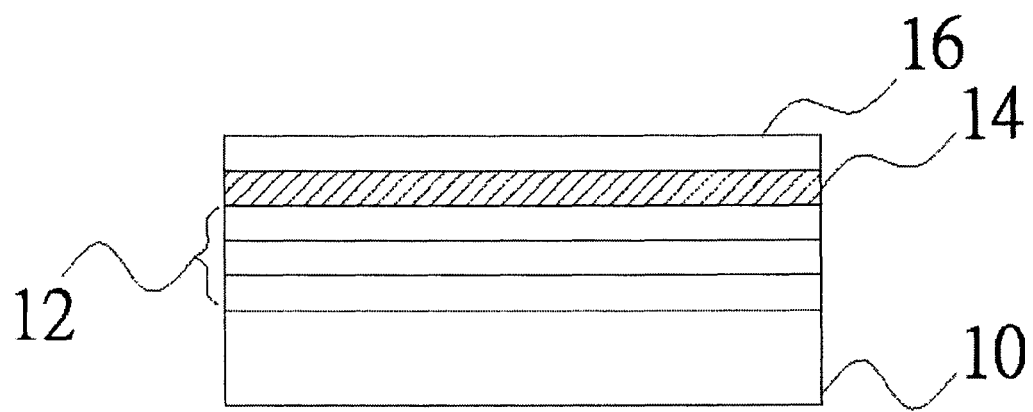
Figure 1E:
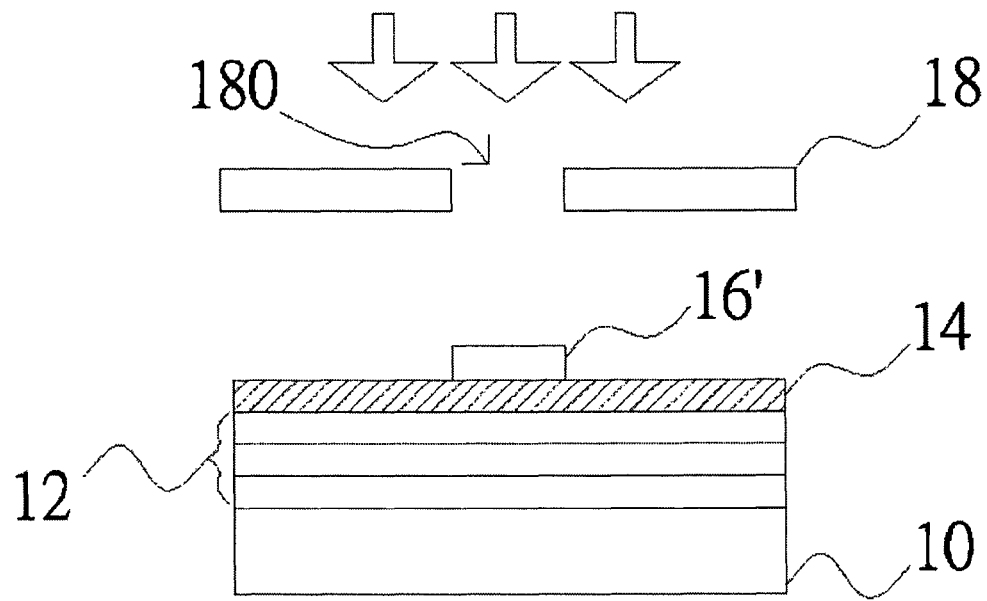
Figure 1F:
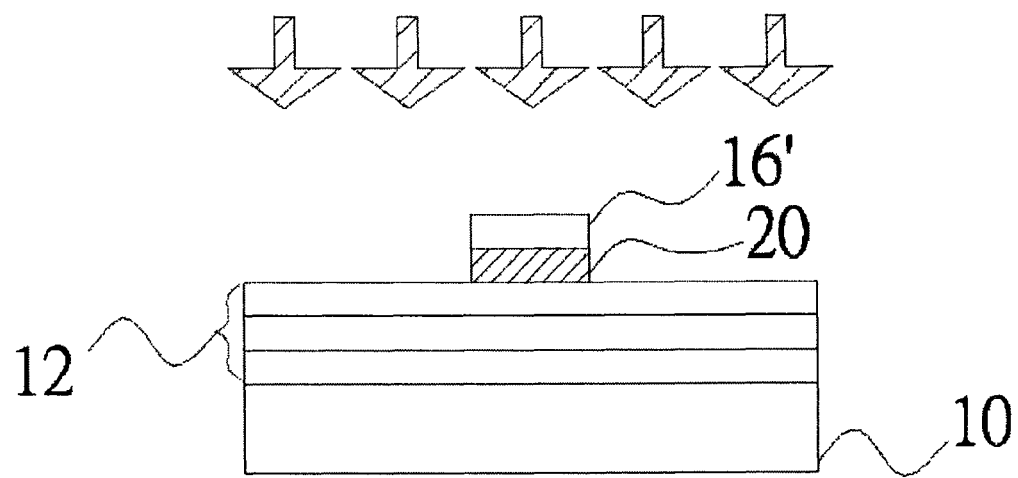
Figure 1G:
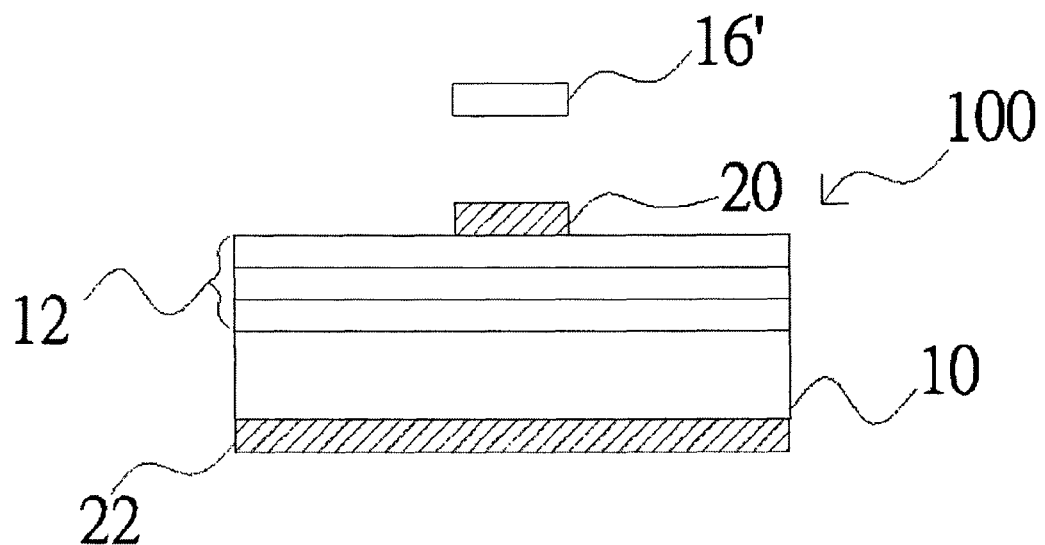
Figure 2A:
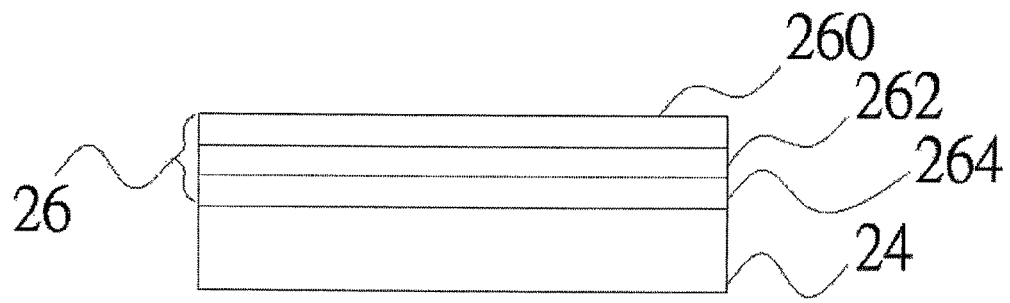
FIGS. 2A-2E illustrate a process flow of forming a photoelectronic device in accordance with one embodiment of the present application.

The first embodiment of the present application is illustrated from FIG. 2A to FIG. 2E. Referring to FIG. 2A, a substrate 24 is provided first. A semiconductor stack layer 26 is formed on the substrate 24 and includes at least a first conductive type semiconductor layer 260, an active layer 262, and a second conductive type semiconductor layer 264 from up to down in this embodiment. The semiconductor stack layer 26 can be formed of materials selected from the GaN series, AlGaInP series, and GaAs series materials.

Figure 2B:
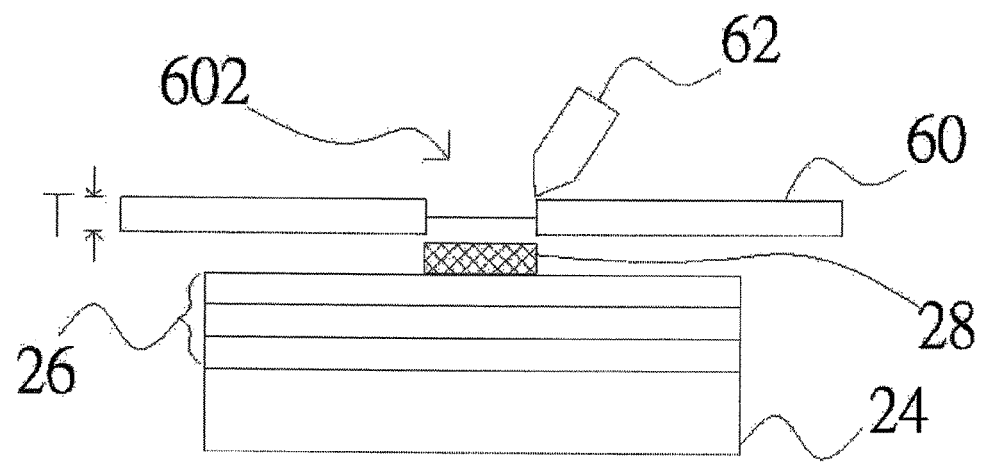

Referring to FIG. 2B, a metal adhesive 28 is formed on the semiconductor stack layer 26 by a printing technology. In this embodiment, a screen printing technology is adopted. First, a screen 60 is provided, and the metal adhesive 28 is printed on the semiconductor stack layer 26 through the meshes 602 by the scraper 62. An area of the semiconductor stack layer 26 covered by the metal adhesive 28 and the thickness of the metal adhesive 28 is defined by controlling the thickness T of the screen 60 and the size of the meshes 602.

The metal adhesive 28 mentioned above includes metal particles and solvent. The material of the metal particles is at least selected from the group consisting of gold, silver, copper, molybdenum, nickel, zinc, tin, aluminum, beryllium, germanium, palladium, titanium, platinum and the alloys thereof. The metal particles size is between 1 nm and 1000 nm, and a better size is smaller than 100 nm. In addition, the solvent contained in metal adhesive 28 is organic solvent in this embodiment.

Figure 2C:
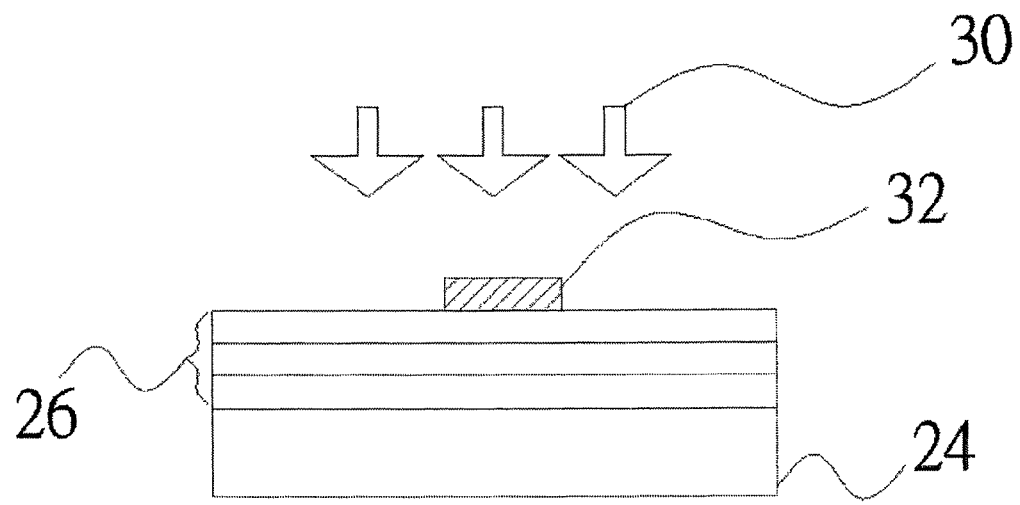
Figure 3:
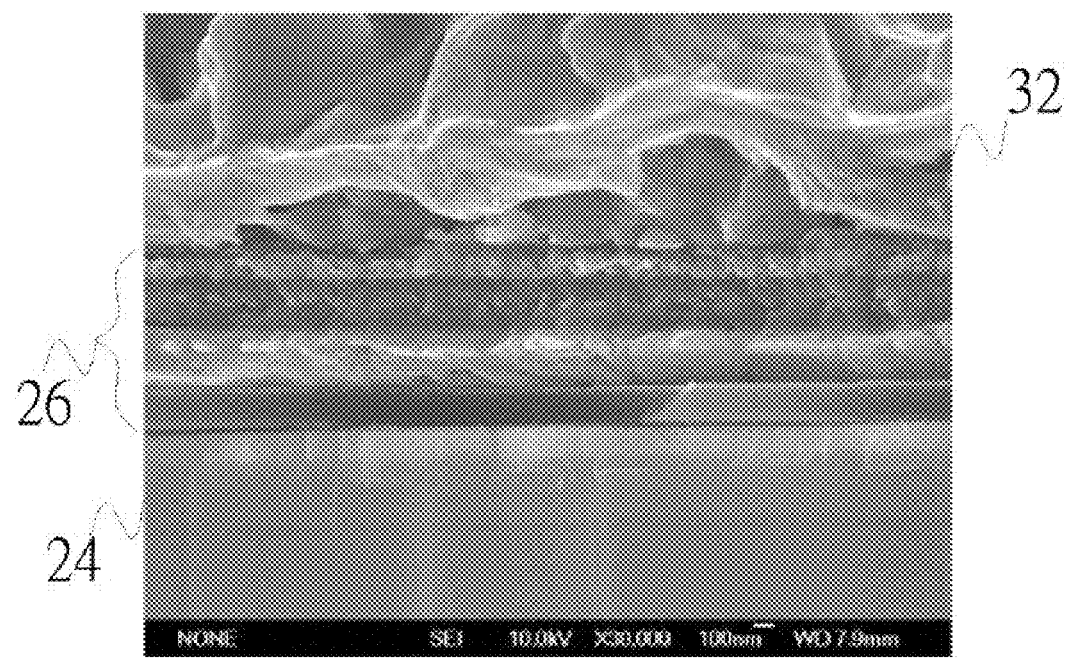
FIG. 3 illustrates an enlarged sectional view of a structure of the photoelectronic device in accordance with one embodiment of the present application.

Referring to FIG. 2C, energy 30 is then provided to the metal adhesive 28, where the energy can be heat in this embodiment, to increase the temperature of the metal adhesive 28. When the temperature is raised from 100° C. to 1200° C., the organic solvent is evaporated from the metal adhesive 28 first because it has a lower boiling temperature. The remaining metal particles are then sintered to form a porous metal bulk in the high temperature environment as an electrode 32. FIG. 3 is a perspective enlarged view at a magnification of about 30000 times of the photoelectronic device in accordance with one embodiment of present application. FIG. 3 shows that an ohmic contact is formed between the electrode 32 and the semiconductor stack layer 26 after the metal adhesive is sintered to form the electrode 32 in high temperature and combined tightly with the semiconductor stack layer 26.

Figure 2D:
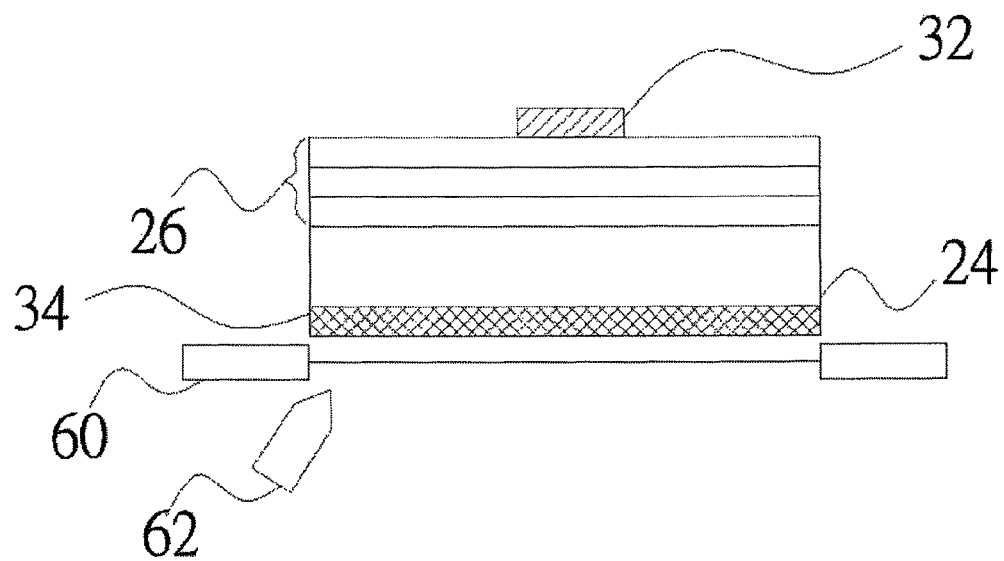
Figure 2E:
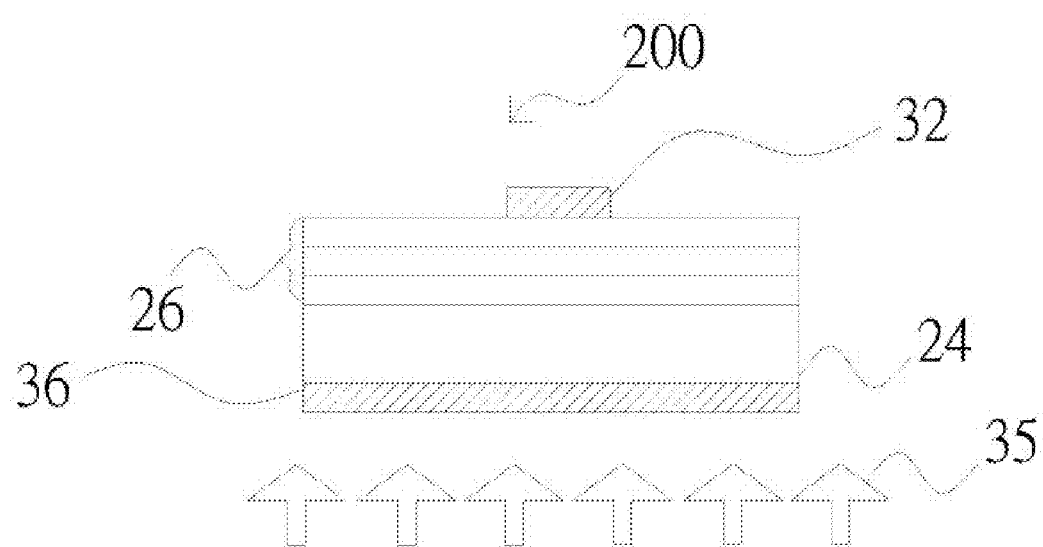

Besides, if the substrate 24 is a conductive substrate such as silicon, SiC, ZnO, GaAs, GaP, or Ge, as FIG. 2D indicates, another metal adhesive 34 can be formed under the substrate 24 by a printing technology. Finally, as FIG. 2E indicates, another electrode 36 is formed by heating the metal adhesive with energy 35, then a photoelectronic device 200 is achieved by the above-mentioned production process.

Figure 4A:
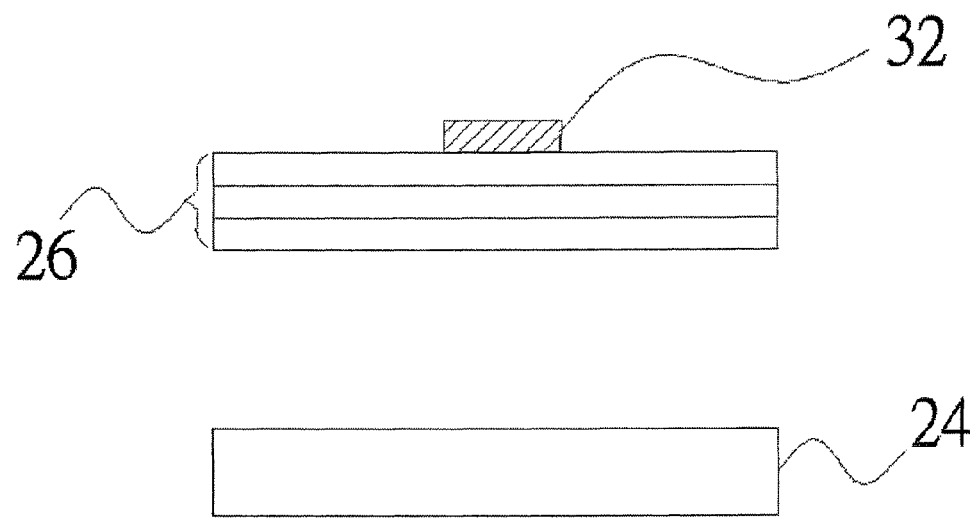
FIGS. 4A-4C illustrate a process flow of forming a photoelectronic device in accordance with another embodiment of the present application.
Figure 4B:
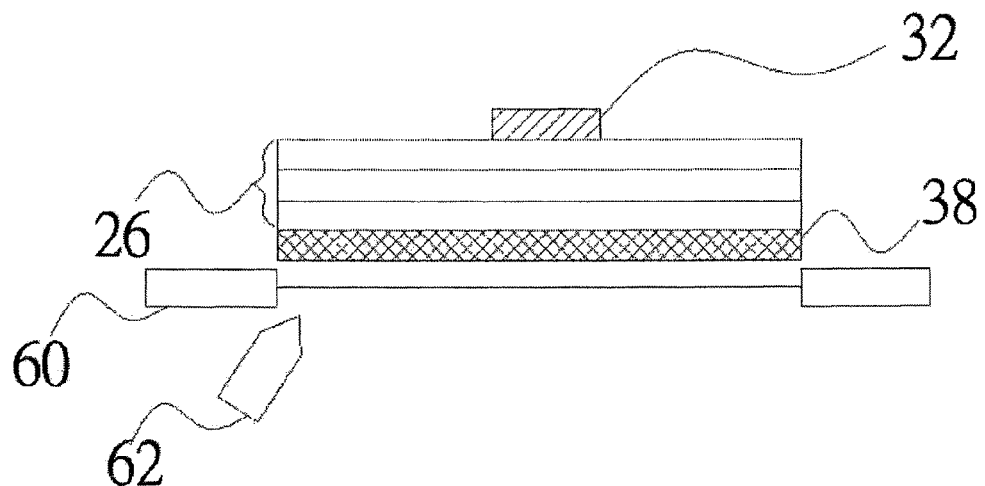
Figure 4C:
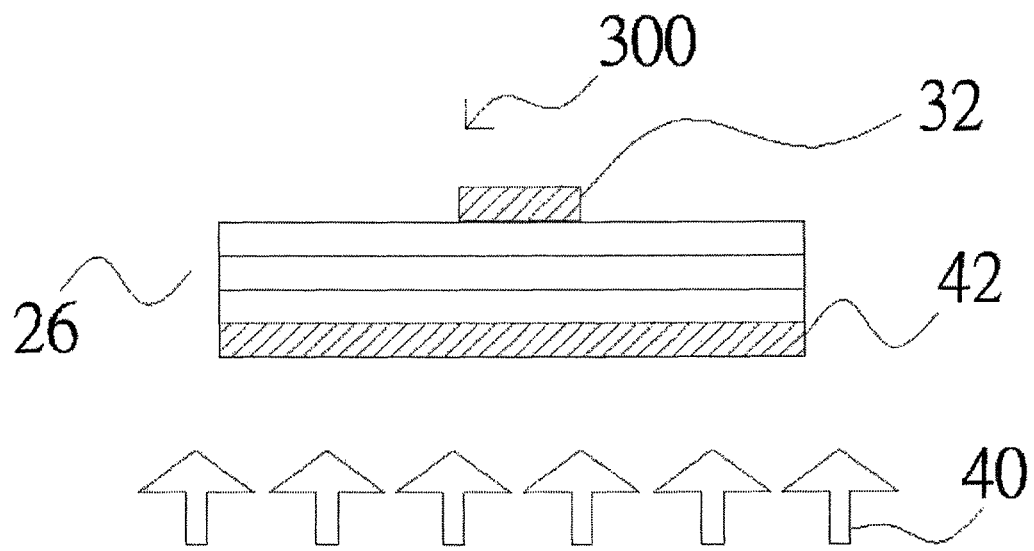

FIG. 4A to FIG. 4C illustrate the structures in accordance with another embodiment of the present application. As FIG. 4A indicates, if the substrate 24 is an insulation substrate such as sapphire, glass, diamond, it can be removed by etching, mechanic polishing, or laser lift-off as shown in FIG. 2C. FIG. 4B indicates that another metal adhesive 38 is formed on the lower contact surface between the semiconductor stack layers 26 and the substrate 24 by a printing technology. Finally, as FIG. 4C shows, another electrode 42 is formed by providing the energy 40 on the metal adhesive 38, and therefore obtain another photoelectronic device 300.

FIG. 5A to FIG. 5D are the diagrams of the process flow to form a photoelectronic device in accordance with further another embodiment of the present application.

Figure 5A:
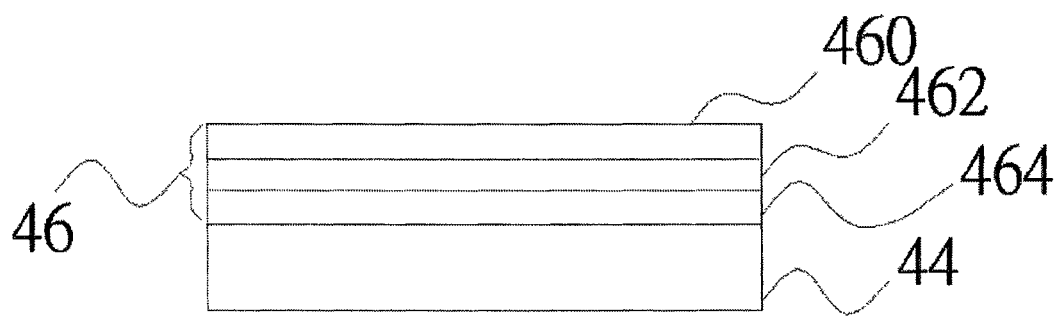
FIGS. 5A-5D illustrate a process flow of forming a photoelectronic device in accordance with further another embodiment of the present application.

As FIG. 5A shows, a substrate 44 is provided and a semiconductor stack layer 46 is formed on the substrate 44. The semiconductor stack layer 46 includes at least a first conductive type semiconductor layer 460, an active layer 462, and a second conductive type semiconductor layer 464 from up to down. Furthermore, the above-mentioned substrate 44 is an insulation substrate in this embodiment.

Figure 5B:
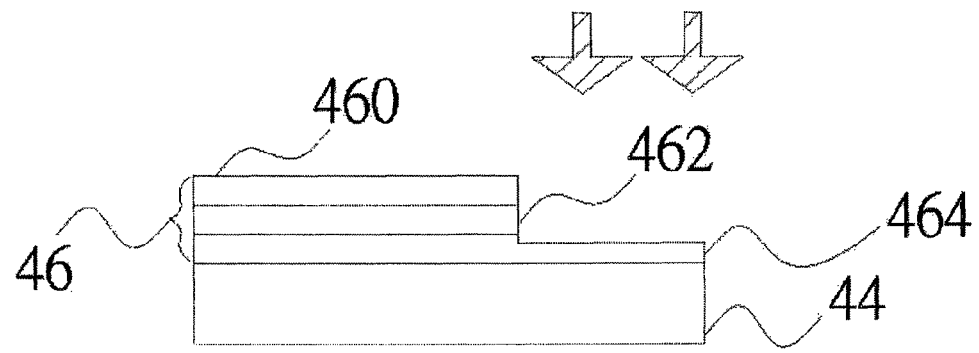
Figure 5C:
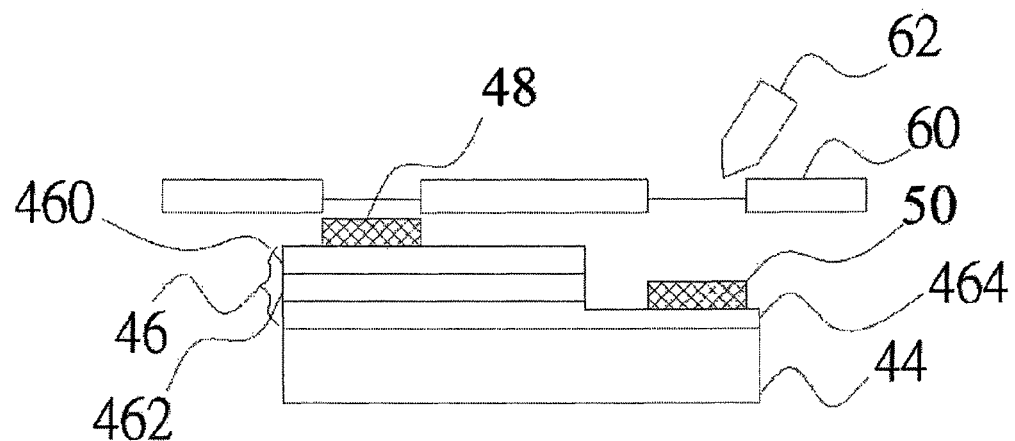

FIG. 5B then shows that a portion of the upper surface of the semiconductor stack layer 46 is etched until a portion of the second conductive type semiconductor layer 464 is exposed by the lithography and etching technology. Next, FIG. 5C indicates that a first metal adhesive 48 and a second metal adhesive 50 are formed on the upper surface of the first conductive type semiconductor 460 and the exposed surface of the second conductive type semiconductor 464 respectively by a printing technology.

Figure 5D:
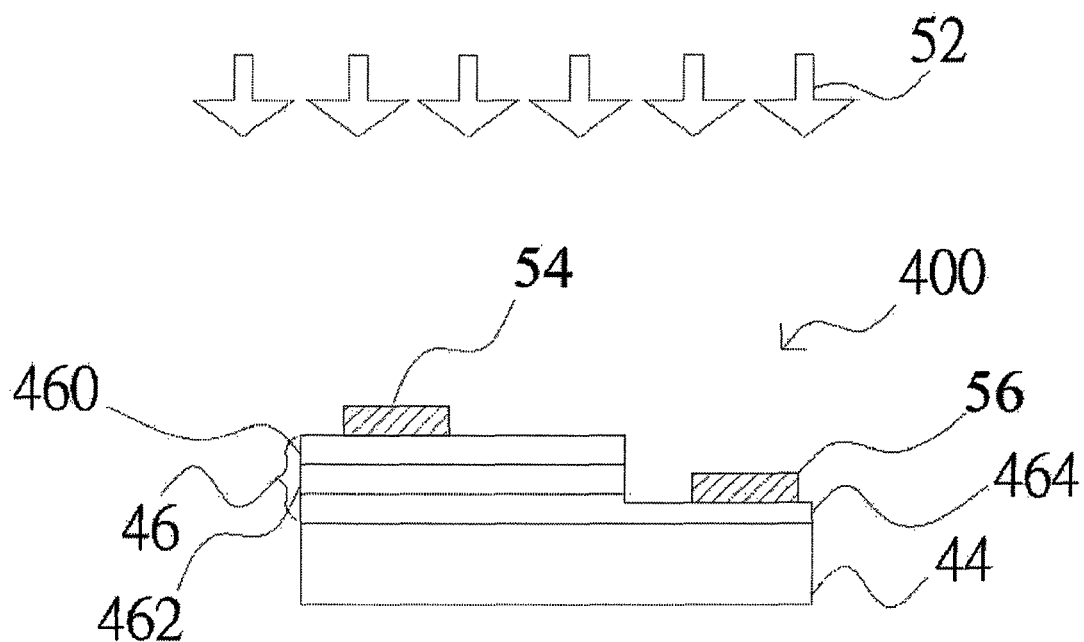

Finally, as FIG. 5D shows, energy 52 is provided to increase the temperatures of the first metal adhesive 48 and the second metal adhesive 50, and they are sintered to form a first electrode 54 and a second electrode 56 respectively in the high temperature environment. A photoelectronic device 400 is formed accordingly.

Figure 6A:
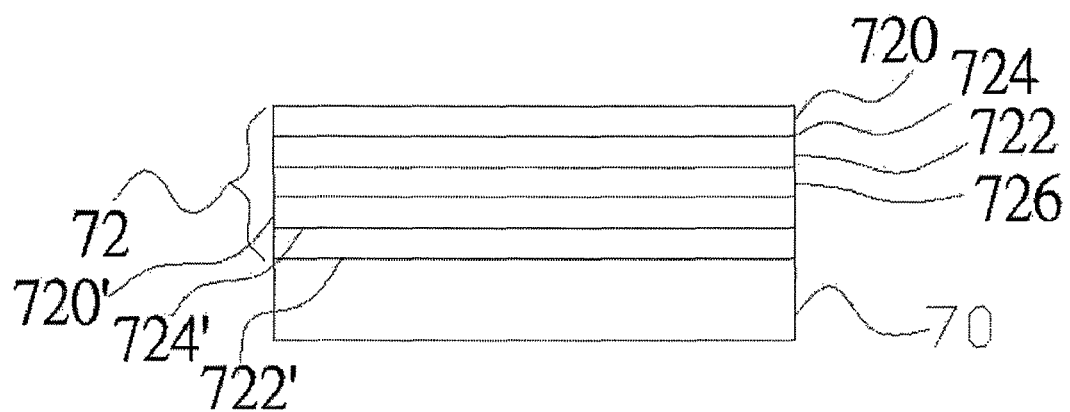
FIGS. 6A-6F illustrate a process flow of forming a photoelectronic device in accordance with further another embodiment of the present application.
Figure 6B:
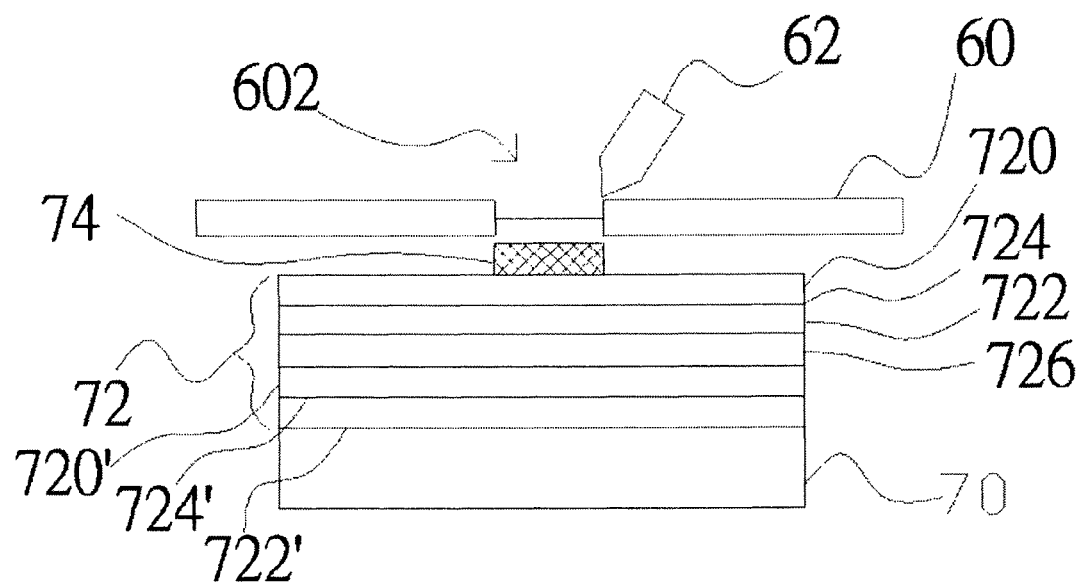

FIG. 6A to FIG. 6F are the diagrams of the process flow to form a photoelectronic device in accordance with another embodiment of the present application. Referring to FIG. 6A, a germanium substrate 70 is provided and a semiconductor stack layer 72 is formed on the germanium substrate. The semiconductor stack layer 72 can be formed of materials at least one or more elements selected from the group consisting of gallium, aluminum, indium, arsenic, phosphorous, nitrogen, and silicon. For example, the GaAs series, AlGaInP series, GaN series, GaInP series, InP series, InGaAsP series, AlGaAs series, AlGaInAs series, InGaNAs series, InGaN series or silicon. The semiconductor stack layer 72 has at least one pn junction stacked by a first conductive type semiconductor layer and a second conductive type semiconductor layer. In this embodiment, the semiconductor stack layer 72 includes a first n-type semiconductor layer 720, a first p-type semiconductor layer 722, a second n-type semiconductor layer 720', and a second p-type semiconductor layer 722' from up to down to form a first pn junction 724 and a second pn junction 724'. It further includes a tunnel junction structure 726 between the first p-type semiconductor layer 722 and the second n-type semiconductor layer 720'. Followed by FIG. 6B, a metal adhesive 74 is formed on the semiconductor stack layer 72 by a printing technology. In this embodiment, the printing technology adopted is the screen printing technology, which a screen 60 is provided first, and then the first metal adhesive 74 is printed on the semiconductor stack layer 72 through the meshes 602 by a scraper 62.

Figure 6C:
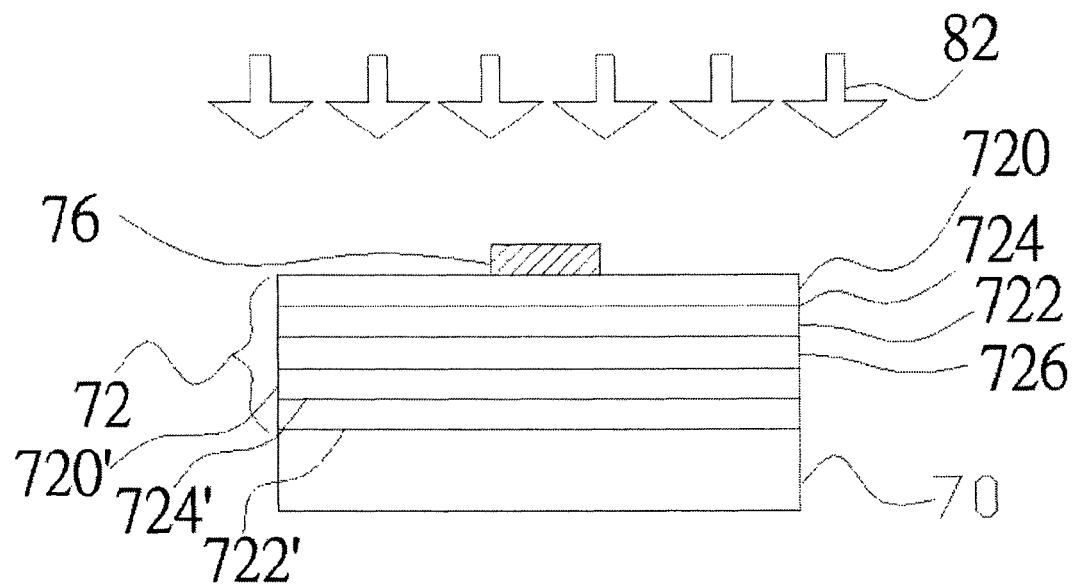
Figure 6D:
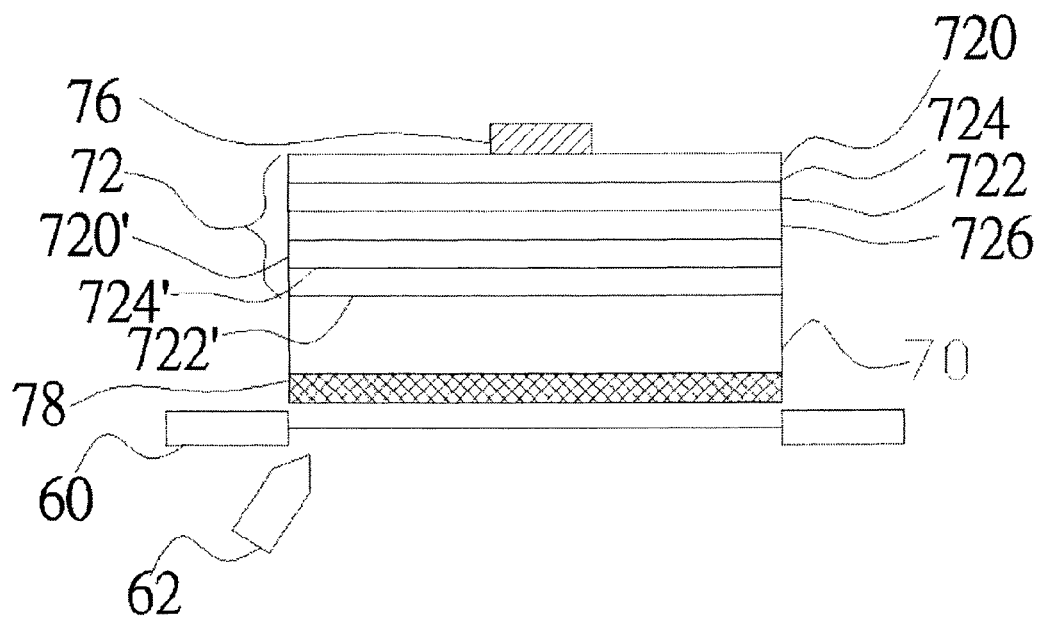
Figure 6E:
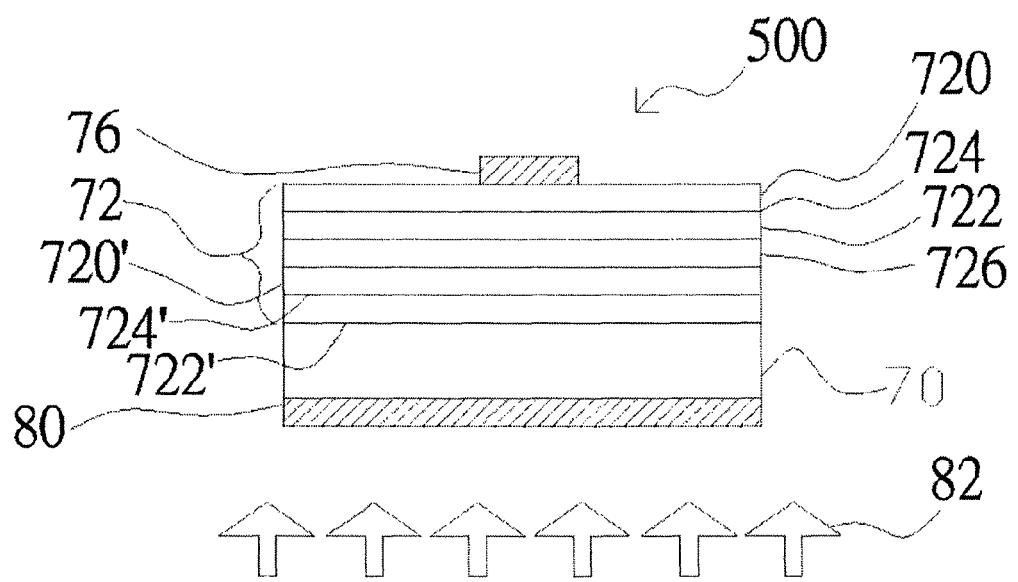

Referring to FIG. 6C, energy 82 is provided to increase the temperature of the first metal adhesive 74 and is sintered to form a first electrode 76 in the high temperature environment. FIG. 6D shows that a second metal adhesive 78 is formed under the substrate 70 by a printing technology. Finally, as FIG. 6E indicates, the second metal adhesive 78 mentioned above is sintered to form a second electrode 80 in the high temperature environment, and then a photoelectronic device 500 is obtained.

Figure 6F:
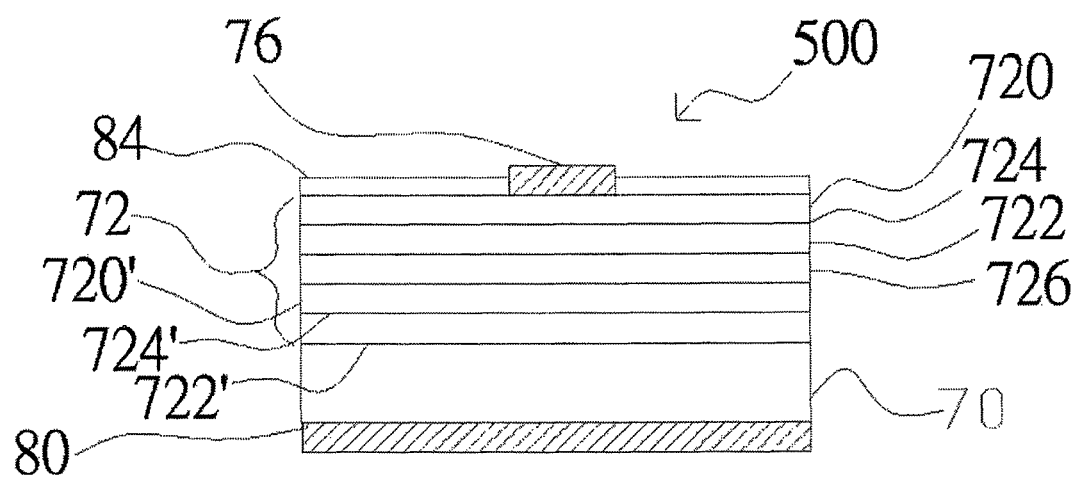

Furthermore, as FIG. 6F indicates in this embodiment, the process further includes forming an anti-reflection layer 84 on the semiconductor stack layer 72 which can enhance the probability of the light emitting to the semiconductor stack layer 72.

As the above-mentioned, the application discloses a method for manufacturing an electrode. The process includes steps of forming a metal adhesive on a semiconductor stack layer by a printing technology and forming a metal electrode by energizing the metal adhesive. Because the printing metal adhesive area and the thickness can be controlled easily by the screen printing technology, the time-consuming problem of the metal evaporation can be improved, and the definition of the size and position of the electrode is simplified comparing with the conventionally lithography etching technology in the photoelectronic device manufacture process. The production cost of a photoelectronic device is therefore reduced sufficiently.

Other embodiments of the application will be apparent to those skilled in the art from consideration of the specification and practice of the invention disclosed herein. It is intended that the specification and examples be considered as exemplary only, with a true scope and spirit of the invention being indicated by the following claims.

We claim:

1. A method for manufacturing a photoelectronic device, comprising:
    providing a semiconductor stack layer;
    etching a portion of the surface of the semiconductor stack layer, wherein the surface of the semiconductor stack layer includes an etched portion and an unetched portion;
    forming a first metal adhesive by a printing technology on the unetched portion of the surface of the semiconductor stack layer;
    providing a first energy on the first metal adhesive to form a first electrode, wherein an ohmic contact is formed between the first electrode and the unetched portion of the surface of the semiconductor stack layer;
    forming a second metal adhesive by a printing technology on the etched surface of the semiconductor stack layer; and
    providing a second energy on the second metal adhesive to form a second electrode, wherein an ohmic contact is formed between the second electrode and the etched surface of the semiconductor stack layer.

2. The method for manufacturing a photoelectronic device according to claim 1, further providing a substrate between the second electrode and the semiconductor stack layer.

3. The method for manufacturing a photoelectronic device according to claim 2, wherein the material of the substrate is selected from silicon, silicon carbide, zinc oxide, gallium arsenic, gallium phosphide, germanium conductive materials or sapphire, glass, diamond insulation materials.

4. The method for manufacturing a photoelectronic device according to claim 1, wherein the material of the semiconductor stack layer comprising at least one or more elements selected from the group consisting of gallium, aluminum, indium, arsenic, phosphorous, nitrogen, and silicon.

5. The method for manufacturing a photoelectronic device according to claim 1, wherein the semiconductor stack layer including at least a first conductive type semiconductor layer, an active layer, and a second conductive type semiconductor layer from up to down.

6. The method for manufacturing a photoelectronic device according to claim 1, wherein the semiconductor stack layer including at least one p-n junction which is stacked by a first conductive type semiconductor layer and a second conductive type semiconductor layer.

7. The method for manufacturing a photoelectronic device according to claim 1, wherein the semiconductor stack layer further including a tunnel junction structure.

8. The method for manufacturing a photoelectronic device according to claim 1, wherein the first metal adhesive and the second metal adhesive comprising metal particles and solvent.

9. The method for manufacturing a photoelectronic device according to claim 8, wherein the metal particles are at least one material selected from the group consisting of gold, silver, copper, molybdenum, nickel, zinc, tin, aluminum, beryllium, germanium, palladium, titanium, platinum, and the alloys thereof.

10. The method for manufacturing a photoelectronic device according to claim 8, wherein the energy is heat.

11. The method for manufacturing a photoelectronic device according to claim 1, further including a step of forming an anti-reflector layer on the semiconductor stack layer.

* * * * *